(12) United States Patent
Milano et al.

(10) Patent No.: US 8,183,935 B2
(45) Date of Patent: May 22, 2012

(54) PHASED SHIFTED OSCILLATOR AND ANTENNA

(76) Inventors: Alberto Milano, Rehovot (IL); Hillel Weinstein, Tel Aviv (IL)

(*) Notice: Subject to any disclaimer, the term of this patent is extended or adjusted under 35 U.S.C. 154(b) by 171 days.

(21) Appl. No.: 12/443,478

(22) PCT Filed: Oct. 3, 2006

(86) PCT No.: PCT/IL2006/001144
§ 371 (c)(1),
(2), (4) Date: Mar. 29, 2009

(87) PCT Pub. No.: WO2008/041222
PCT Pub. Date: Apr. 10, 2008

(65) Prior Publication Data
US 2010/0103043 A1    Apr. 29, 2010

(51) Int. Cl.
*H03L 7/00*    (2006.01)

(52) U.S. Cl. ............................. 331/16; 342/81; 342/157
(58) Field of Classification Search ............... 331/16; 342/81, 157
See application file for complete search history.

(56) References Cited

U.S. PATENT DOCUMENTS

| | | | | |
|---|---|---|---|---|
| 5,977,910 A | * | 11/1999 | Matthews | 342/368 |
| 6,759,980 B2 | * | 7/2004 | Chen et al. | 342/372 |
| 7,800,453 B2 | * | 9/2010 | Milano | 331/34 |

* cited by examiner

*Primary Examiner* — James E Goodley

(57) ABSTRACT

This invention describes new and improved phased shifted injection oscillator, a phased shifted injection locked push-push oscillator and a phased array antennas (PAA). The PAAs in accordance with an exemplary embodiment of the present invention are low cost, and therefore can be used in various commercial applications, such as wireless communication or satellite mobile television.

33 Claims, 14 Drawing Sheets

PHASED SHIFTER INJECTED OSCILLATOR

PHASED SHIFTED OSCILATOR AND ANTENNA

FIELD OF THE INVENTION

The present invention relates generally to a device and process for sending and receiving radio wave energy for utilizing information, and more specifically to phased array antennas and their application in wireless communication.

BACKGROUND OF THE INVENTION

Antennas are designed to transmit and receive electromagnetic waves. A phased array antenna is an antenna comprising a plurality of radiator elements (radiators) with a directive radiation pattern (beam) which can be controlled by controlling individual radiator elements (radiators) or groups of radiator elements in the antenna. In general, the steering direction of the radiation pattern is determined by control of the phases of the signal to or from the radiator elements. In conventional phased array antennas the phase control is achieved by phase shifters. The specific phases are typically determined by a digital signal processing (DSP) subsystem.

One example of phased array antennas is disclosed in U.S. patent application Ser. No. 6,759,980 disclosing a phased array antenna comprising an input, a feed network electronically coupled to the input, a plurality of radiators, a plurality of phase shifters for providing phase shifts for the signals prior to transmitting the signals to the radiators or receiving the signals from the radiators, and a controller for controlling the phase shift provided by the phase shifters.

FIG. 1 illustrates a simplified block diagram of a system generally referenced 100 comprising a multiple power divider 140 for distributing the reference signal 101 to one or more transmitter/receiver (T/R) modules, and a simple phased array antenna (PAA) 150, known in the art. FIG. 1 illustrates electronically steering the wave front of a signal. Three possible wave fronts 162, 164, 166 are shown. Reference signal 101 is inputted to the multiple power divider 140. The reference signal is normally generated by a reference signal generator (not shown in FIG. 1).

The power divider 140 distributes the reference signal 101 to four phase shifters 112, 114, 116, 118. The phase shifters 112, 114, 116, 118 provide respective phase shifts s1, s2, s3, s4 degrees (not shown). The wave front 162, 164, or 166 is determined by the phase shifts s1, s2, s3, s4 of the phase shifters. The phased array antenna 150 comprises phase shifters 112, 114, 116, 118, amplifiers 122, 124, 126, 128, and radiators 132, 134, 136, 138. Each of the phase shifters 112, 114, 116 118 is connected to an amplifier 122, 124, 126, 128. Each of the amplifiers 122, 124, 126, 128 transfers an amplified and phase shifted signal to a respective radiator. The PAA of FIG. 1 can steer the wave front only in one dimension, either an azimuth dimension or an elevation dimension.

An exemplary PAA comprises an array of radiators in which the relative phases of the electromagnetic signals radiated by the radiators are varied in such a way so as to cause the radiation pattern of the phased array antenna to be in a desired direction. In FIG. 1, numeral 161 illustrates a radiation pattern (beam).

The simplified phased array antenna 150 illustrated by FIG. 1 typically comprises an array of T/R modules 102, 104, 106, 108 and an array of radiators 132, 134, 136, 138. In the architecture of the PAA of FIG. 1, each radiator is connected to one T/R module. In FIG. 1 only the transmit part of the T/R modules 102, 104, 106, 108 are shown.

Exemplary PAAs use transmitters (TR) or receivers (RX) or T/R modules, which perform functions, such as, shifting the phase of a signal by a predetermined amount of degrees. For example T/R module 102 in FIG. 1 phase shifts a signal by s1 degrees.

An exemplary conventional T/R Module 102 comprises among other elements a phase shifter 112 and an amplifier 122. Exemplary PAA use a plurality of T/R modules, each T/R module comprising a phase shifter (PS). PS are electronic devices enabling the antenna beam to be electronically steered, in a desired direction, without mechanically repositioning the PAA. Conventional PAA are extremely expensive and of high power-consumption, therefore they are mainly used in military applications, such as aircraft radars and missile-radars. For instance, in an exemplary PAA, about 4000 phase shifters are used; each phase shifter costs several thousands U.S. dollars, resulting in a total cost of millions of U.S. dollars for such PAA. There is therefore a need for low cost phased array antennas giving about the same performance of the conventional high cost phased array antennas.

SUMMARY OF THE INVENTION

An aspect of some embodiments of the invention relates generally to a Phased Array Antenna ("PAA") system and more specifically for a PAA for use in wireless or telecommunication networks, such as Wi-Fi, Wi-Max, cellular communication, or satellite mobile television.

The PAA of this invention is an active phased array antenna. The word active is used to emphasize that the PAA is being steered electronically and not mechanically, also by using a T/R module for each radiator.

An aspect of some embodiments of the invention relates to a PAA for high quality video services, high speed data services, Voice over IP (VOIP), or interne telephony. An aspect of some embodiments of the invention relates to a new apparatus or circuit called hereinafter a phased shifted injection oscillator (PSIO).

An aspect of some embodiments of the invention relates to a new apparatus or circuit called hereinafter a phased shifted injection locked push-push oscillator (PSIPPO).

An aspect of some embodiments of the invention relates to a phased array antenna system comprising of a plurality of PSIOs or a plurality of PSIPPOs.

An aspect of some embodiments of the invention relates to a low cost or an inexpensive PAA. In exemplary embodiments of the invention, a PAA using a plurality of PSIPPOs achieves about the same or better performances, such as higher efficiency, as of a conventional PAA system that uses conventional prior art T/R modules based on conventional phase shifting circuits.

An aspect of some embodiments of the invention relates to a PAA using a plurality of PSIPPOs enabling azimuth or elevation beam steering.

An aspect of some embodiments of the invention relates to a PAA using a plurality of PSIPPOs that generates narrow beams.

In exemplary embodiments of the invention, the narrow beams allow a wider coverage range or a lower electromagnetic interference than conventional antenna based on prior art This enables a significant increase in data throughput or increase in the numbers of simultaneous users of a wireless network, such as Wi-Fi, Wi-Max, and other wireless networks.

In accordance with an exemplary embodiment of the invention there is provided an oscillator comprising a reflection amplifier; a band rejection filter comprising at least one variable capacitor and at least one resonator, wherein said band rejection filter is connected to said reflection amplifier. In exemplary embodiments of the invention the band rejection filter is a two port band rejection filter. In exemplary embodiments of the invention an input reference signal is injected into the oscillator. In exemplary embodiments of the invention the output signal of the oscillator is locked. In exemplary embodiments of the invention the oscillator is voltage controlled.

In accordance with an exemplary embodiment of the invention there is provided an oscillator comprising a power divider; a time delay unit; a band rejection filter; at least two reflection amplifiers; and a power combiner. In exemplary embodiments of the invention the band rejection filter comprises at least two variable capacitors and at least two inductors implementing a resonator. In exemplary embodiments of the invention the variable capacitors are voltage controlled by a signal generated by a DSP unit.

In accordance with an exemplary embodiment of the invention there is also provided a phased shifted injection locked push-push oscillator comprising a power divider operative to divide a received reference signal into a first portion and into a second portion, the second portion is time delayed by a predetermined amount of delay time, relative to the first portion; and a push-push oscillator receiving the first and second portions and generating an output signal; wherein the push-push oscillator comprises a band rejection filter adapted to change the phase of the first or second portions resulting in an output signal having a phase shifted relative to the phase of the reference signal. In exemplary embodiments of the invention the power divider is a zero degree power divider. In exemplary embodiments of the invention the power divider is a Wilkinson power divider. In exemplary embodiments of the invention the generated output signal has stability characteristics about the same as the received reference signal. In exemplary embodiments of the invention the generated output signal has noise characteristics about the same as the received reference signal. In exemplary embodiments of the invention the predetermined amount of delay time is of about half of the period of the reference signal. In exemplary embodiments of the invention the predetermined amount of delay time is an odd multiple of about half of the period of the reference signal. In exemplary embodiments of the invention the generated output signal has the same frequency and about the same noise characteristics the received reference signal. In exemplary embodiments of the invention the generated output signal has stability characteristics about the same as the received reference signal. In exemplary embodiments of the invention the phase shift of the output signal relative to the received reference signal is in the range of about −100 to about +100 degrees. In exemplary embodiments of the invention the band rejection filter comprises at least two variable capacitors. In exemplary embodiments of the invention the variable capacitors are used for changing the resonant frequency of the band rejection filter.

In accordance with an exemplary embodiment of the invention there is also provided a method for phase shifting an injection locked push-push oscillator, comprising dividing a received reference signal into a first portion and into a second portion, the second portion is time delayed by a predetermined amount of delay time, relative to the first portion; receiving the first and second portions by a push-push oscillator; and generating an output signal by the by the push-push oscillator; wherein the push-push oscillator is adapted to change the phase of the first or second portions resulting in an output signal having a phase shifted relative to the phase of the reference signal. In exemplary embodiments of the invention the predetermined amount of delay time the second portion is delayed relative to the first portion is about half the period of the reference signal. In exemplary embodiments of the invention the predetermined amount of time delay the second portion is delayed relative to the first portion is an odd multiple of about half the period of the reference signal.

In accordance with an exemplary embodiment of the invention there is also provided a transmitter/receiver module comprising at least one level of phased shifted injection locked push-push oscillator; and a receiving functionality receiving a sampled portion of power subsequently handled by the at least one level of phased shifted injection locked push-push oscillators.

In accordance with an exemplary embodiment of the invention there is also provided a method for phase shifting an injection locked push-push oscillator, comprising receiving a first signal having a phase; dividing the first signal and injecting a first portion of the first signal into a band rejection filter and the second portion of the first signal into a time delay unit; changing the resonant frequency of the first or second portion of the first signal; oscillating the first portion and the second portion of the first signal between the band rejection filter and at least two reflection amplifiers; combing the first and second portions of the first signal from the at least two reflection amplifiers; and outputting the combined signal. In exemplary embodiments of the invention the first signal is a reference signal or signal from a previous phase shifting an injection locked push-push oscillator. In exemplary embodiments of the invention the combined signal is outputted to another phase shifting an injection locked push-push oscillator or to a radiator. In exemplary embodiments of the invention the combined signal has about twice the frequency and twice the phase shift of the first signal. In exemplary embodiments of the invention the time delay unit creates a time delay of about half the period of the first signal.

In accordance with an exemplary embodiment of the invention there is also provided a phased array antenna having a steer able antenna beam in azimuth and elevation the antenna comprising: a plurality of radiators, amplifiers, mixers, sampling couplers and phase shifter injection locked oscillators, said phase shifter injection locked oscillators are for steering the antenna beam in the elevation and azimuth direction. In exemplary embodiments of the invention each of the phased shifted injection locked push-push oscillators comprise a power divider operative to divide a received reference signal into a first portion and into a second portion, the second portion is time delayed by a predetermined amount of delay time, relative to the first portion; and a push-push oscillator receiving the first and second portions and generating an output signal; wherein the push-push oscillator comprises a band rejection filter adapted to change the phase of the first or second portions resulting in an output signal having a phase shifted relative to the phase of the reference signal. In exemplary embodiments of the invention a first portion of the phase shifted injection locked push-push oscillators are being phase shifted by a first degree; a second portion of the phase shifted injection locked push-push oscillators are being phase shifted by a second degree, and a third portion of the phase shifted injection locked push-push oscillators are being phase shifted by a third degree, said first degree is relative to said second degree is relative to said third degree. In exemplary embodiments of the invention the phased array antenna is used with a wireless communication device. In exemplary embodiments of the invention the phased array antenna is used with a wireless access point. In exemplary embodiments of the invention the phased array antenna is used with a satellite mobile television system. In exemplary embodiments of the invention the phased array antenna is used with a satellite antenna. In exemplary embodiments of the invention the phased array antenna is used with an antenna connected to a data switching device. In exemplary embodiments of the invention the phased array antenna is used with an antenna connected to a data receiving and transmitting device.

BRIEF DESCRIPTION OF THE FIGURES

Exemplary non-limited embodiments of the invention will be described, with reference to the following description of the embodiments, in conjunction with the figures. The figures are generally not shown to scale and any sizes are only meant to be exemplary and not necessarily limiting. In the figures, identical structures, elements or parts that appear in more than one figure are preferably labeled with a same or similar number in all the figures that they appear in.

DETAILED DESCRIPTION OF EXEMPLARY EMBODIMENTS

This invention describes new and improved phased shifted injection oscillator, a phased shifted injection locked push-push oscillator and a phased array antennas (PAA). The PAAs in accordance with an exemplary embodiment of the present invention are low cost, and therefore can be used in various commercial applications, such as wireless communication or satellite mobile television. The PAAs of the present invention provides significant enhancements and improvements over prior art PAA, as will be shown from the specifications and figures.

A phased array antenna according to the present invention comprises a plurality phase shifting elements and other electronic components. Conventional phase shifters are expensive electronic components or are affected by high RF loss. Both, cost and RF loss contribute to the very high cost of conventional phased array antenna using conventional T/R modules or conventional phase shifters.

Figure 1:
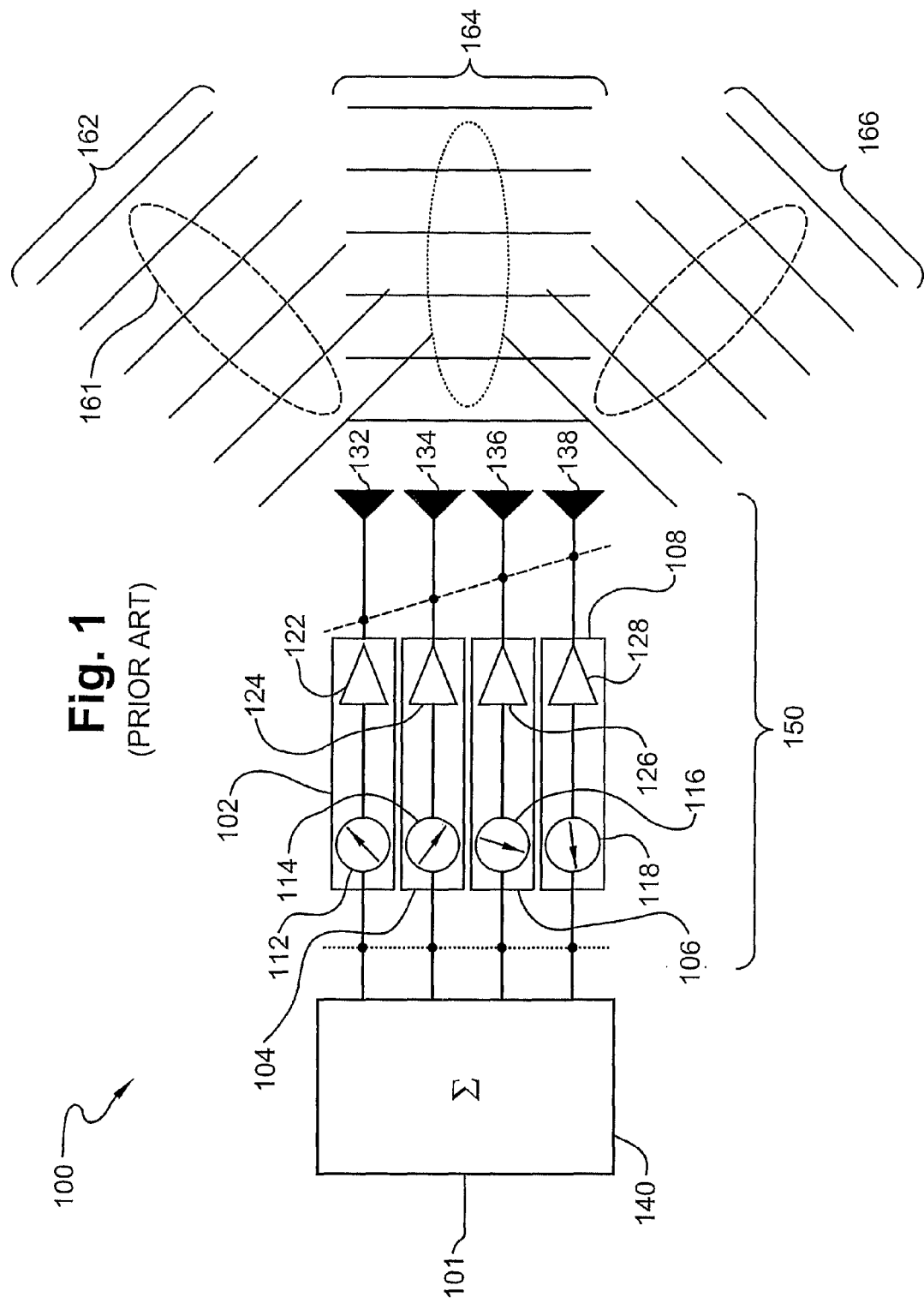
FIG. 1 illustrates a simplified block diagram of a system comprising a multiple power divider and a simple phased array antenna known in the art.

In an exemplary embodiment of the invention a phase shifter, such as 112, 114, 116, or 118 of FIG. 1, is a phased shifted injected oscillators (PSIO) or a phased shifted injected push-push oscillator (PSIPPO), both are new and novel electronic devices of this invention, and are described below. PSIO is described first and than the PSIPPO, which can be regarded as an improvement of the PSIO. Although PSIO or PSIPPO can be used with the structure or architecture illustrated by FIG. 1, this invention discloses a novel distributed structure or architecture of a phased array antenna that has various advantages over the one illustrated by FIG. 1 and over other antennas of the prior art.

Figure 2:
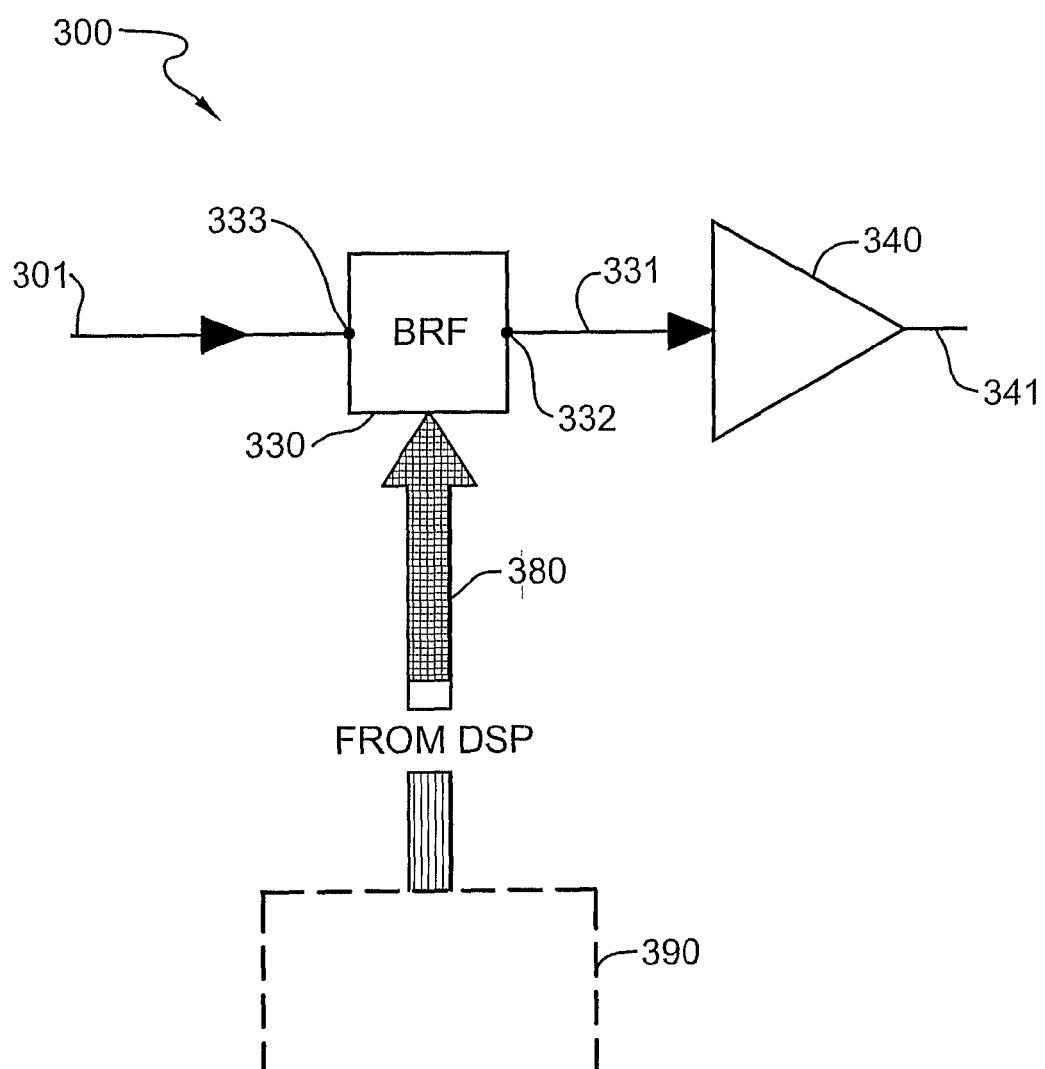
FIG. 2 is a schematic diagram of a phased shifted injection oscillator (PSIO), according to an exemplary embodiment of the invention.

FIG. 2 shows a schematic diagram of a circuit 300, called in this specification PSIO, according to an exemplary embodiment of the invention. The PSIO of FIG. 2 comprises a reflection amplifier 340 connected to a band rejection filter (BRF) 330. The BRF comprises a varactor diode whose bias voltage is controlled by a digital signal processor (DSP) 390. The BRF 330 has two ports 332, 333.

Figure 3:
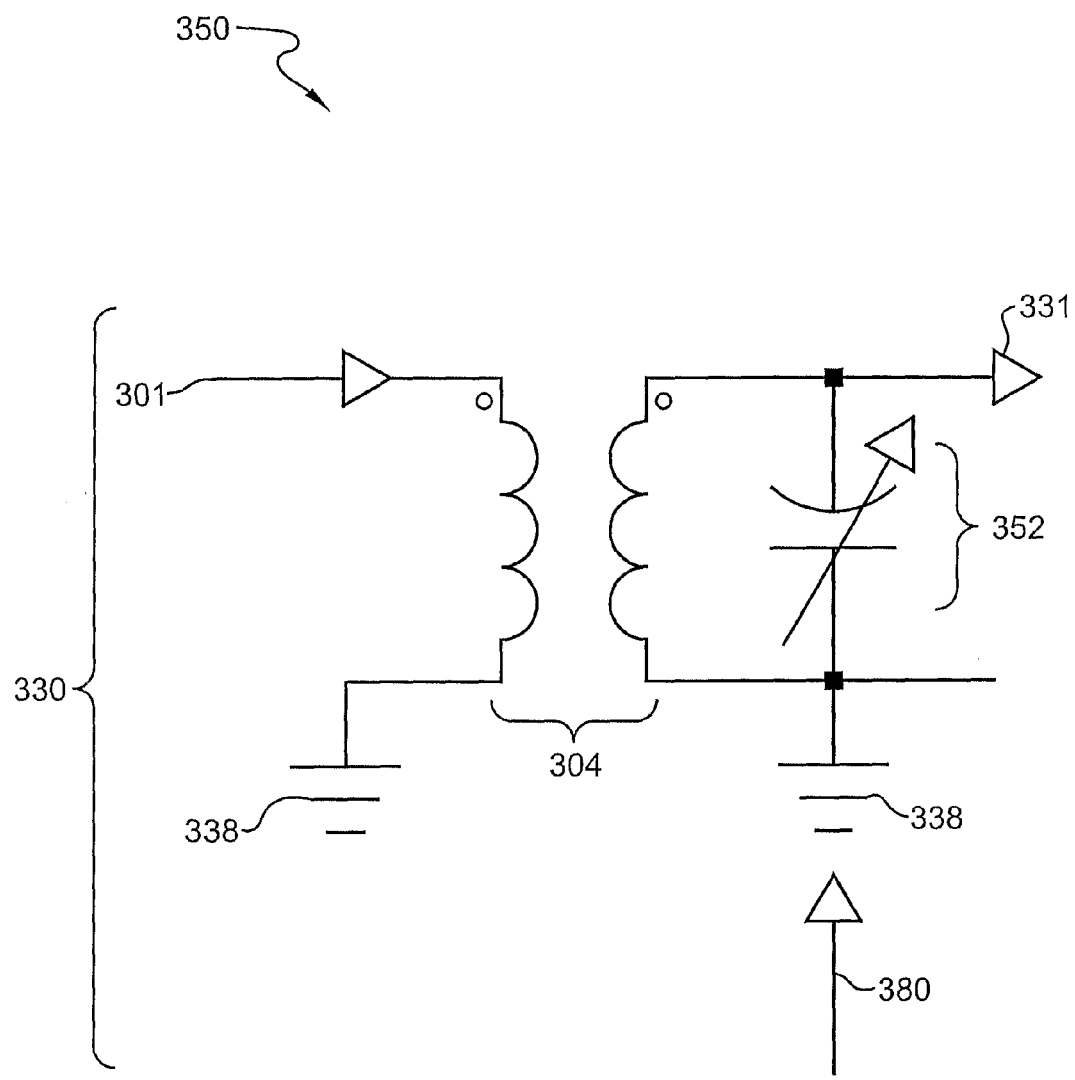
FIG. 3 is a schematic diagram a band rejection filter (BRF) according to an exemplary embodiment of the invention.

FIG. 3 is a schematic diagram 350 of the BRF 330 according to an exemplary embodiment of the invention. The BRF 330 comprises at least one variable capacitor 352 and at least one inductor 304 embedded in an isolating transformer able to resonate with the variable capacitor 352 for making resonance with band rejection filter of the PSIO. Numeral 338 denotes ground. The variable capacitor 352 of FIG. 3 is voltage controlled by signals 380 generated by the DSP 390 (DSP 390 is not shown in FIG. 3).

Figure 4:
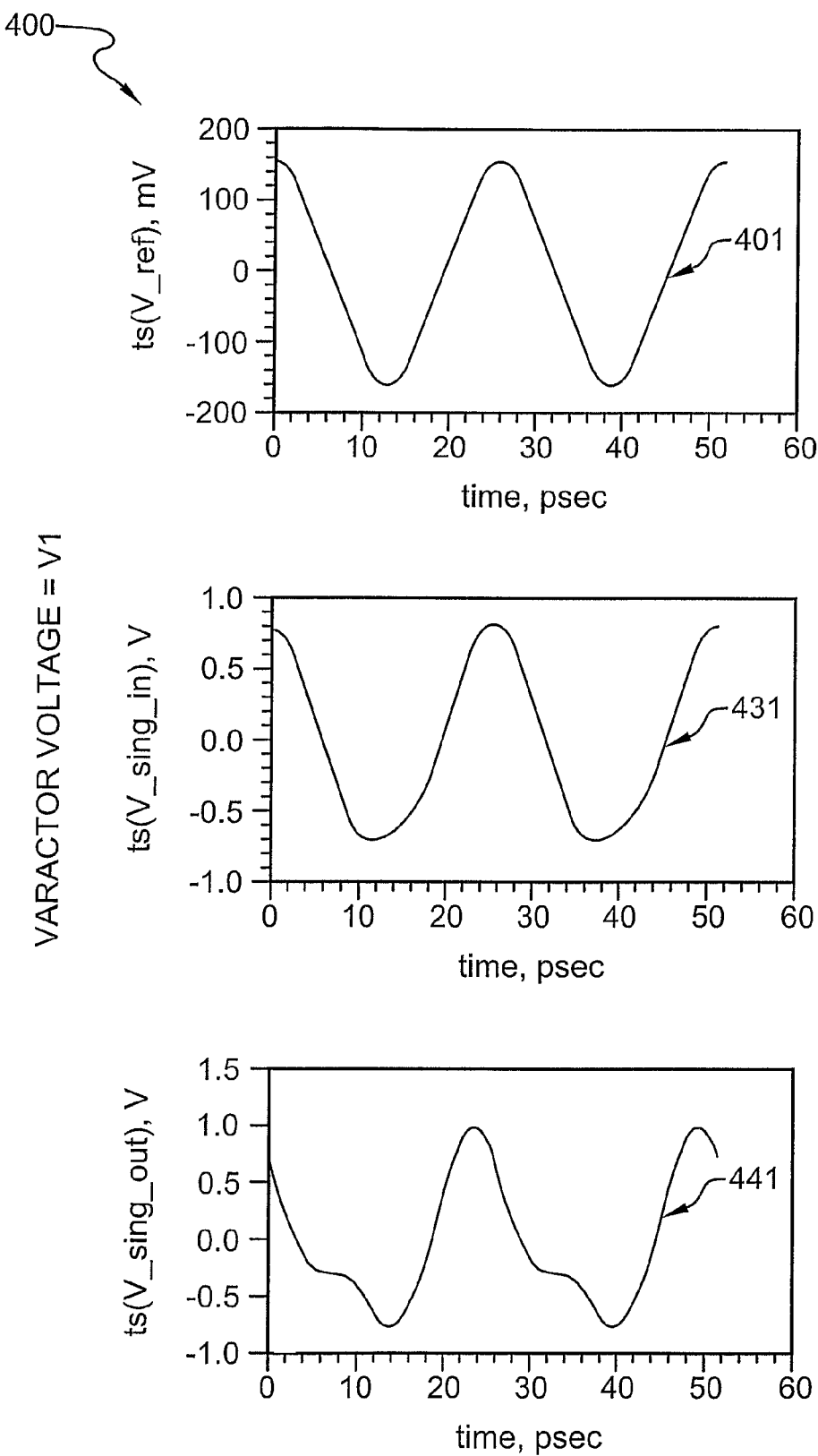
FIGS. 4, 5 are non-limiting examples illustrating a behavior of a PSIO, in accordance with exemplary embodiments of the invention.
Figure 5:
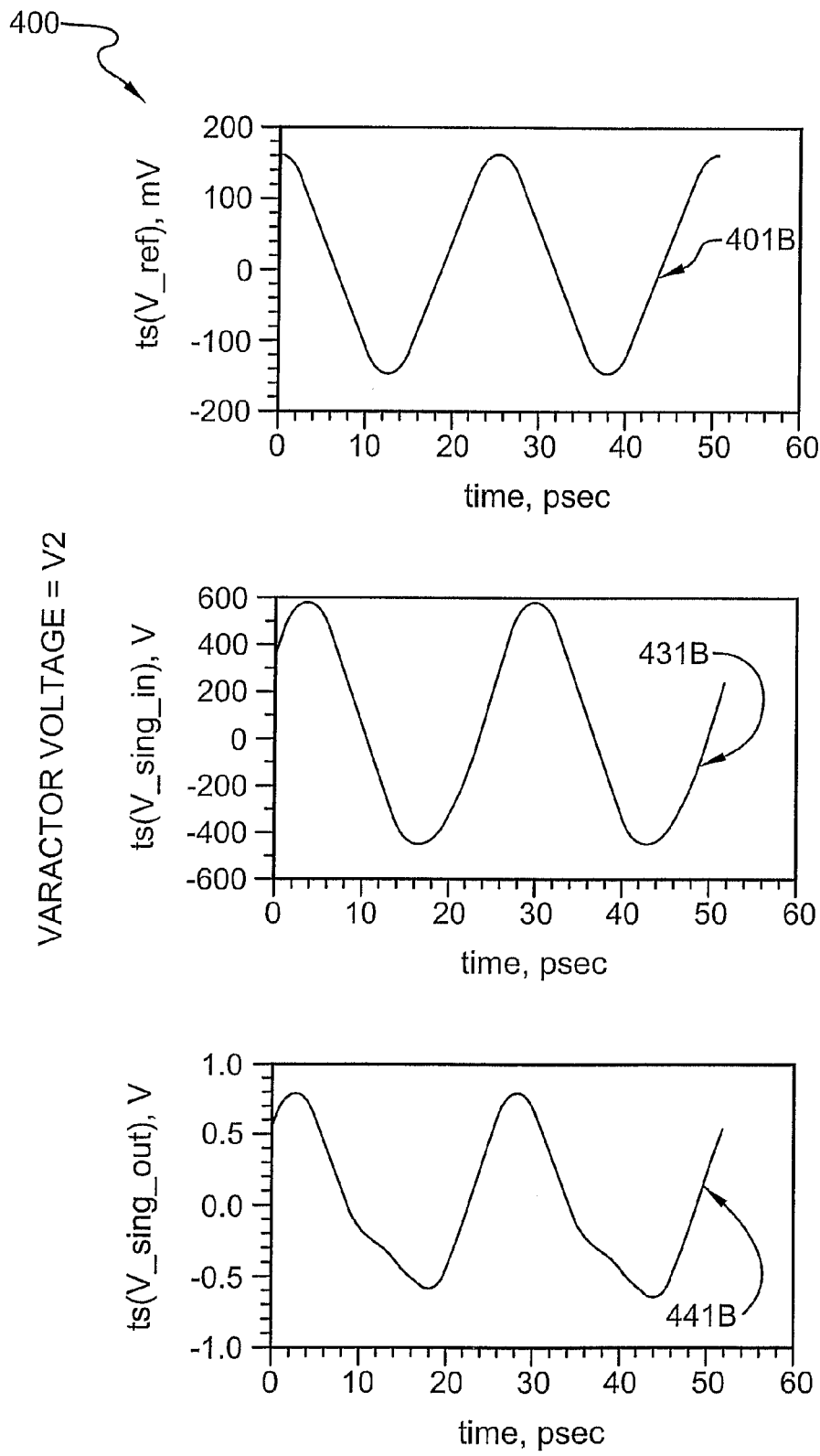

In an exemplary embodiment of the invention signal 301 of FIG. 2 is injected into the PSIO 300 so that the output signal 341 of the PSIO 300 is locked to signal 301. The locking of signal 341 means that signal 341 is also locked and has the same frequency and about the same basic spectral purity as the signal 301. The behavior of the PSIO 300 of FIG. 2 will be better understood together with FIGS. 4, 5. FIGS. 4, 5 are a particular non-limiting example illustrating the behavior of the PSIO 300. The PSIO 300 receives an input RF signal 301 and outputs a signal 341 having the same frequency and about the same basic spectral purity as the input reference signal 301. Waveforms 401, 401B are waveform illustrations of signal 301 for two different voltages V1 and V2 of the variable capacitor 352. Similarly, waveforms 441, 441B illustrate waveforms of signal 341 for two different voltages V1 and V2. It can be seen that signals 441 and 441B have a different phase.

Waveforms 401, 431, 441 represent the time domain voltages at certain locations of the PSIO, corresponding to voltage V1 on the variable capacitor 352. Waveforms 401B, 431B, 441B represent the time domain voltages at certain locations of the PSIO, corresponding to voltage V2 on the variable capacitor 352. It should be noticed that waveform 401 corresponds to 301, waveform 431 corresponds to 331, and waveform 441 corresponds to 341.

In an exemplary or preferred embodiment of the invention the variable capacitor 352 of BRF 300 is used to change the resonant frequency of the BRF 330, and the variable capacitor is controlled by the DSP 390.

Figure 6:
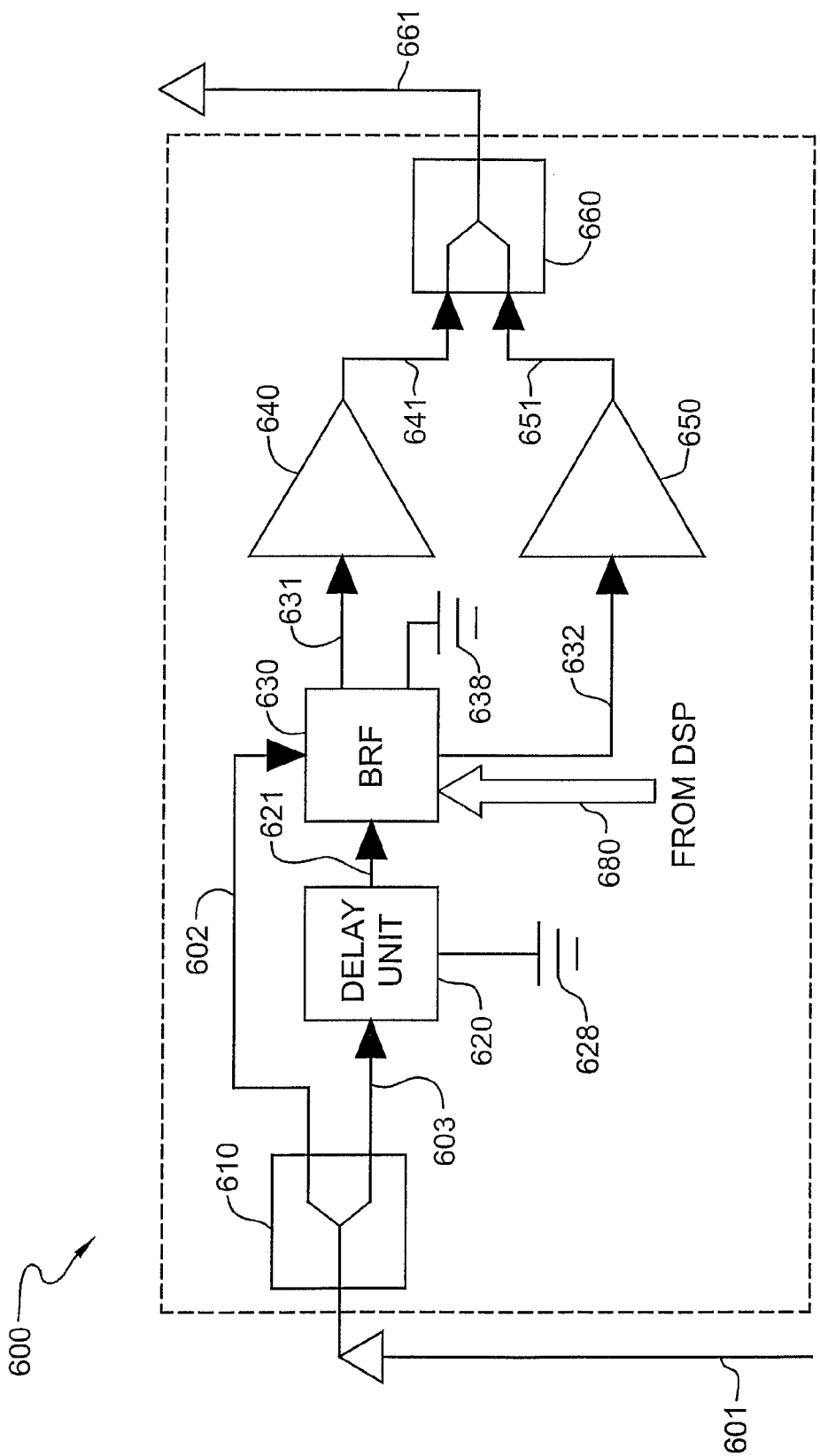
FIG. 6 is a simplified block diagram illustration of a phased shifted injection locked push-push oscillator (PSIPPO), in accordance with an exemplary embodiment of the invention.

FIG. 6 is a simplified block diagram illustration 600 of a phased shifted injection locked push-push oscillator (PSIPPO), in accordance with an exemplary embodiment of the invention. In an exemplary embodiment of the present invention the PSIPPO comprises a power divider 610, a time delay unit 620, a band rejection filter (BRF) 630, at least two reflection amplifiers 640 and 650, a power combiner 660.

Figure 7:
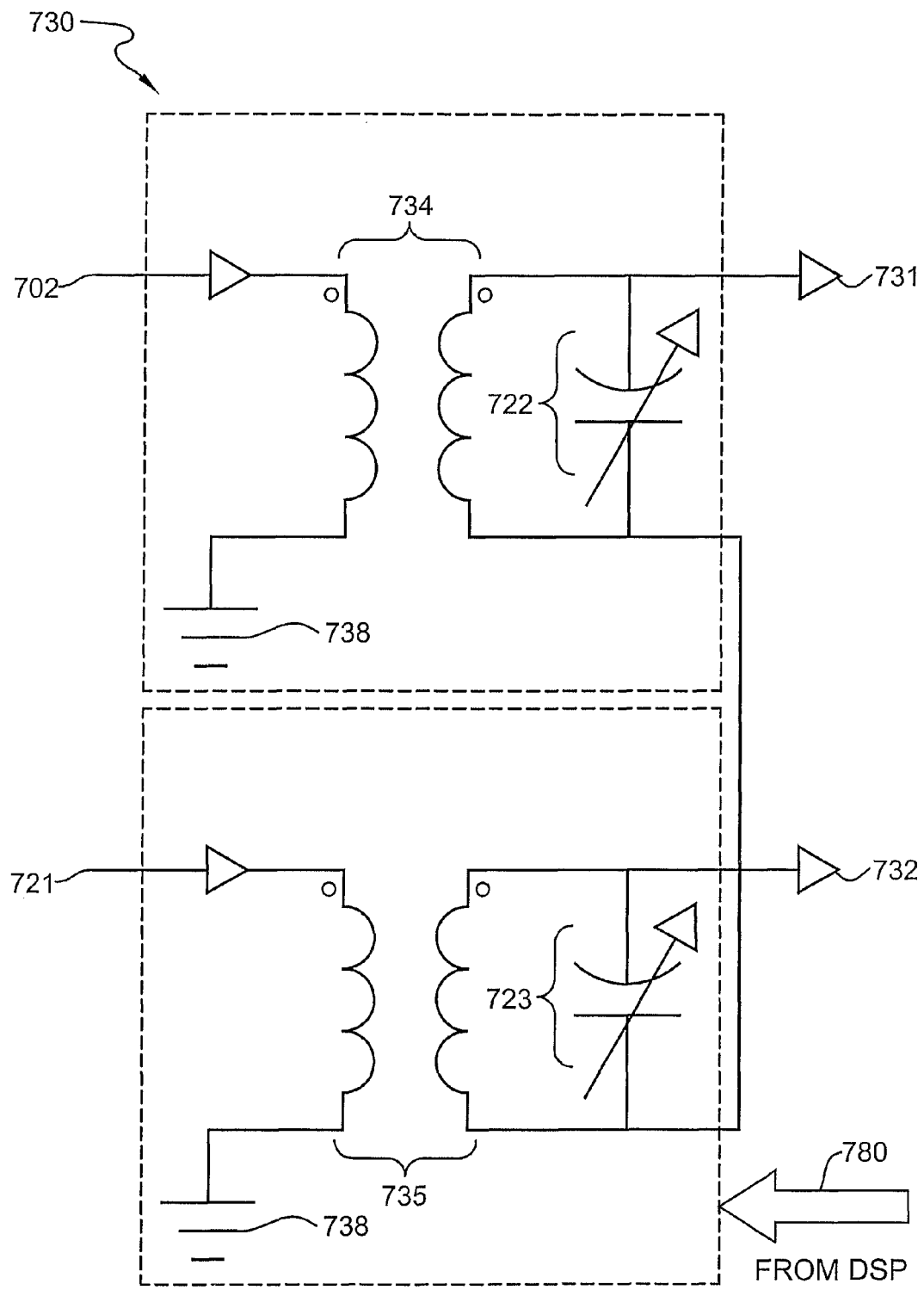
FIG. 7 is a schematic diagram of a BRF, according to an exemplary embodiment of the invention.

FIG. 7 is a schematic diagram of the BRF 630 of FIG. 6, according to an exemplary embodiment of the invention. The BRF 730 comprises at least two inductors 734, 735 embedded in two isolating transformers able to resonate with the variable capacitors 722, 723. Numeral 738 denotes ground. The variable capacitors 722, 723 are voltage controlled by signals 380 generated by the DSP 390 shown in FIGS. 2, 3.

The behavior of the PSIPPO 600 of FIG. 6 will be better understood together with FIGS. 8A, 8B, 8C, 8D. The PSIPPO 600 receives a signal 601 having a certain phase and outputs a signal 661 having the same or a different phase than the input signal 601.

In an exemplary embodiment of the invention signal 601 is a reference signal or a signal from a previous PSIPPO and signal 661 is outputted to another PSIPPO or to a radiator.

Figure 8A:
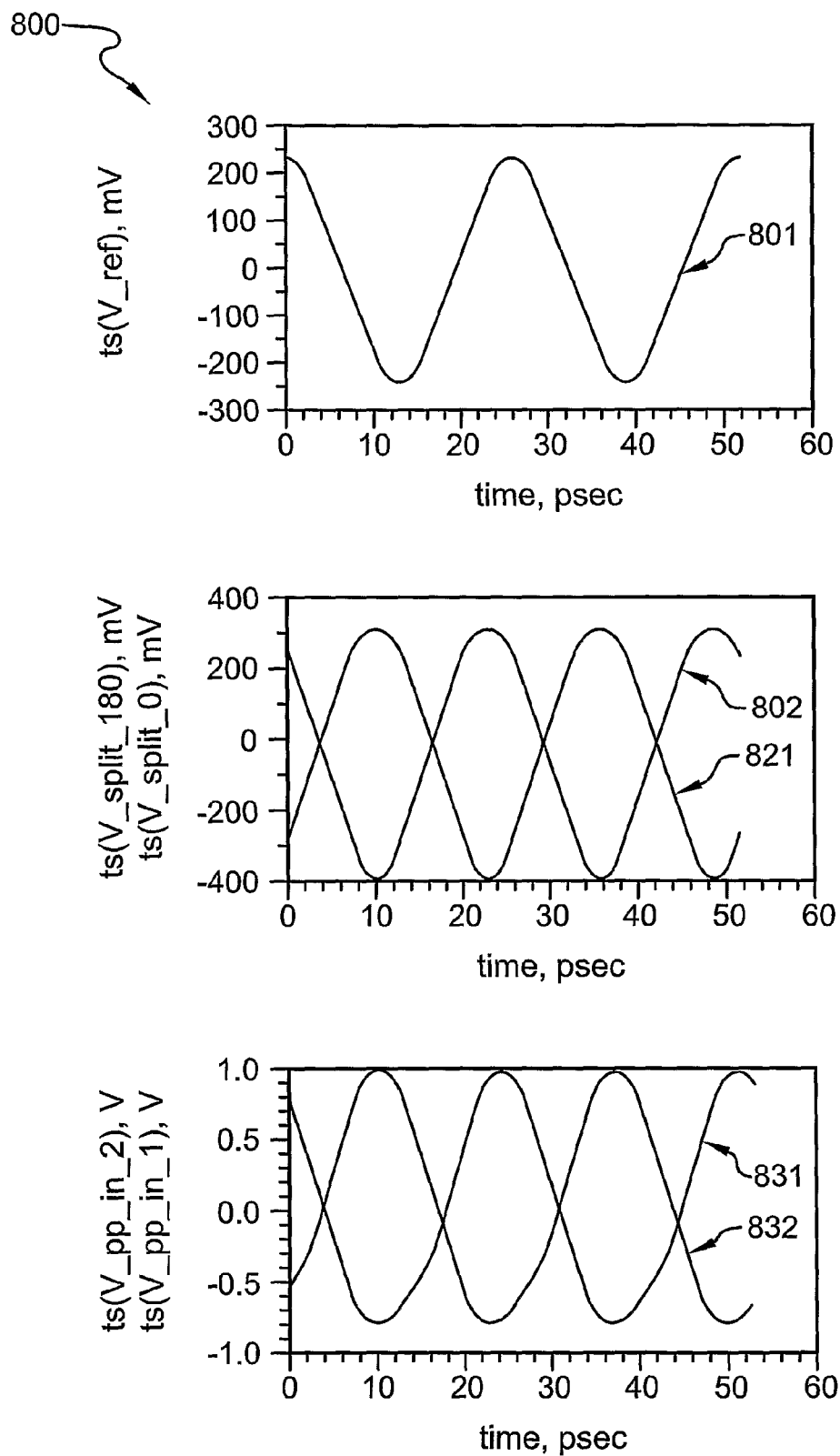
FIG. 8A, 8B, 8C, 8D are non-limiting example illustrating a waveform behavior of a phased shifted injection locked push-push oscillator (PSIPPO), in accordance with exemplary embodiments of the invention.
Figure 8B:
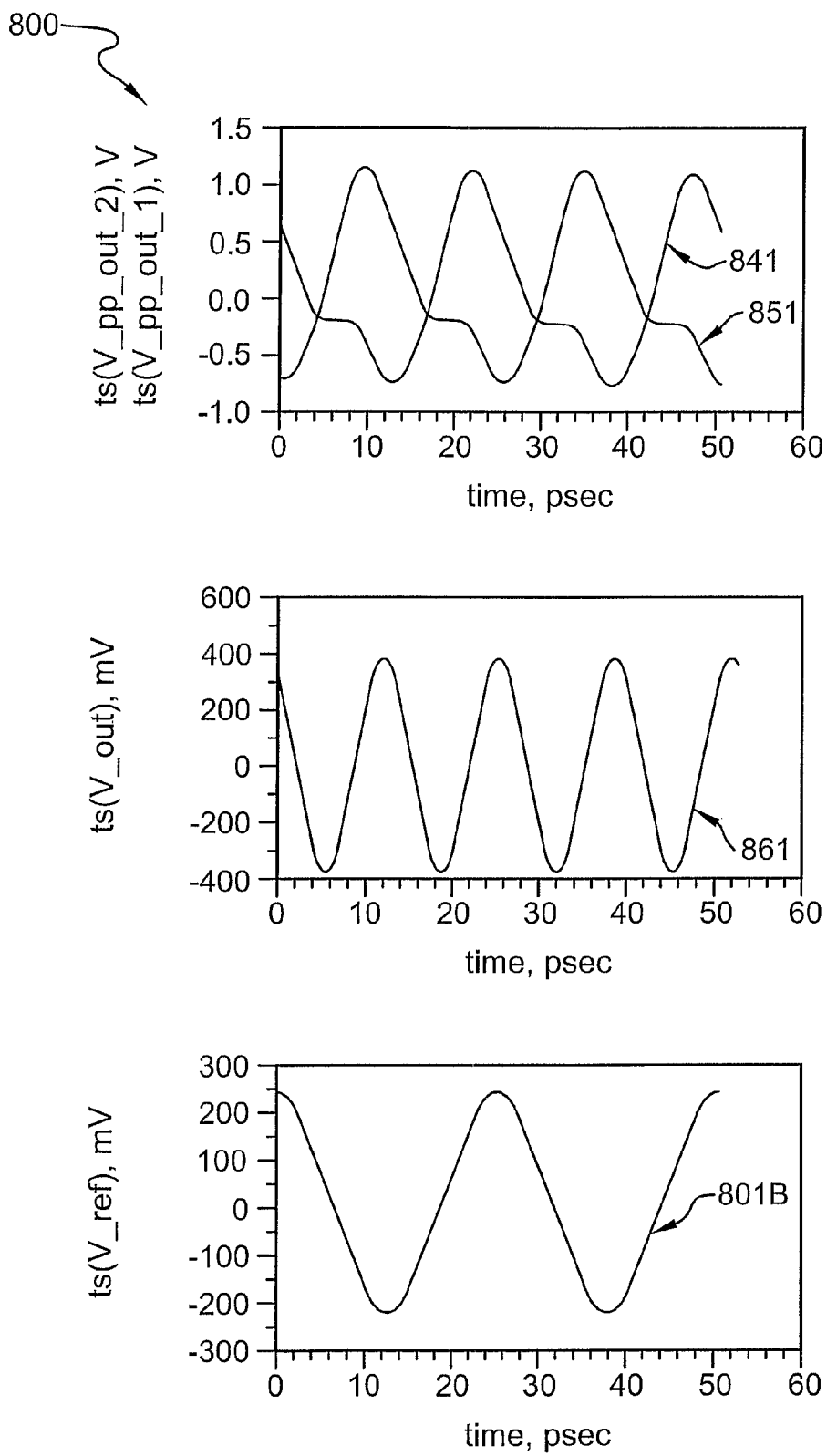
Figure 8C:
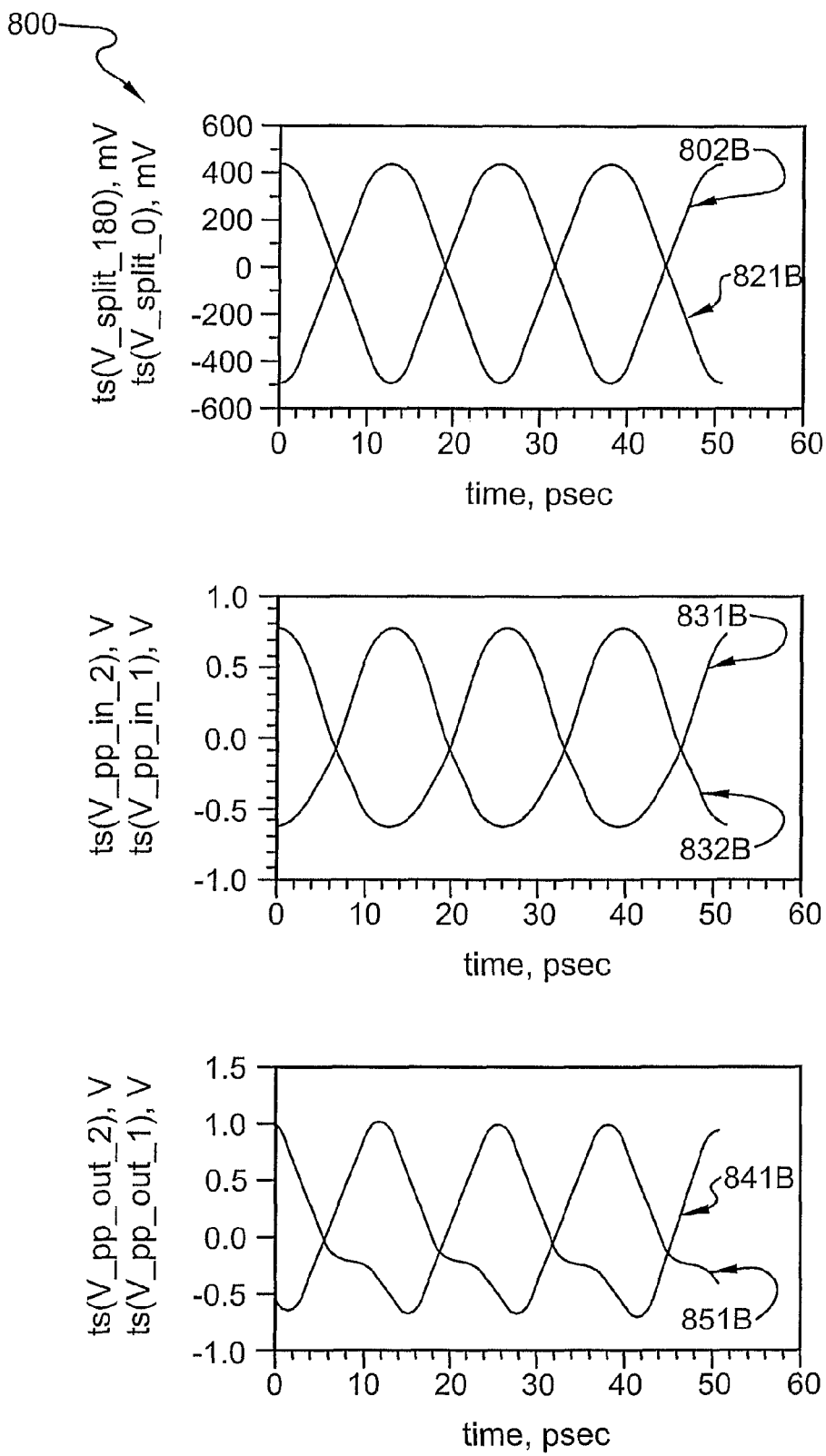
Figure 8D:
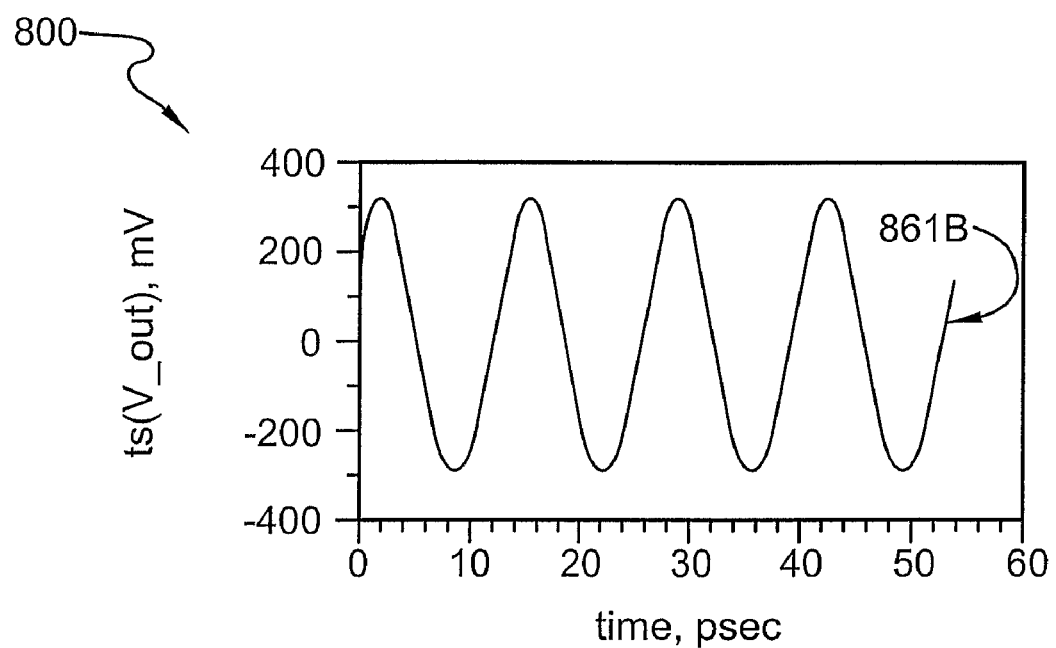

Waveforms 801, 801B in FIGS. 8A, 8B are waveform illustrations of input reference signal 601 for two different voltages V1 and V2 respectively, and waveforms 861, 861B in FIGS. 8B, 8D are waveforms illustration of signal 661 for two different voltages V1 and V2, in a particular non-limiting example. The output signal 661 has twice the frequency and twice the phase angle of the input reference signal 601. A person skilled in the art will appreciate that the output signal 661 can have twice the frequency and about twice the phase angle of the input reference signal 601.

The power divider 610 receives the signal 601 and inject a first portion 602, illustrated by waveforms 802, 802B in FIGS. 8A, 8C and second portion 621 illustrated by waveforms 821, 821B in FIGS. 8A, 8C, into the BRF 630, where the second portion 621 is obtained by using a time delay unit 620, which creates a time delay of about half the period of the reference signal 601. In an alternative exemplary embodiment of the present invention, the time delay is predetermined. In an alternative exemplary embodiment of the present invention, the time delay is an odd multiple of about one half of the period of the reference signal. The signals 602 and 621 entering the BRF 630 have the same power level, but are opposite in phase. A person skilled in the art will appreciate that the signals 602 and 621 entering the BRF 630 may have about the same power level.

The BRF 630 outputs signals 631, 632 illustrated by waveforms 831, 832 respectively, when the bias voltage of the variable capacitors 622, 623 of BRF 630 has a value V1. The BRF 630 outputs signals 631, 632 illustrated by waveforms 831B, 832B respectively, when the bias voltage of the variable capacitors 622, 623 of BRF 630 has a value V2. In an alternative exemplary embodiment of the present invention, the phase shift of the output signal relative to the received reference signal is in the range of about −100 to about +100 degrees. The reflection amplifiers 640 and 650 output signals 641 and 651 correspondingly. Signals 641 and 651 are fed into a combiner 661, which outputs signal 661. Signals 641, 651 are represented by waveforms 841, 851 respectively, when the bias voltage of the variable capacitors 622, 623 of BRF 630 has a value V1. Signals 641, 651 are represented by waveforms 841B, 851B respectively, when the bias voltage of the variable capacitors 622, 623 of BRF 630 has a value V2.

From FIGS. 8A, 8B, 8C, 8D it can be noticed that the frequency of the signal 661, represented by waveforms 861, 861B, has twice the frequency of signal 601. Furthermore, the phase of waveform 861, corresponding to bias voltage V1, differs from the phase of waveform 861B, corresponding to bias voltage V2.

Figure 9:
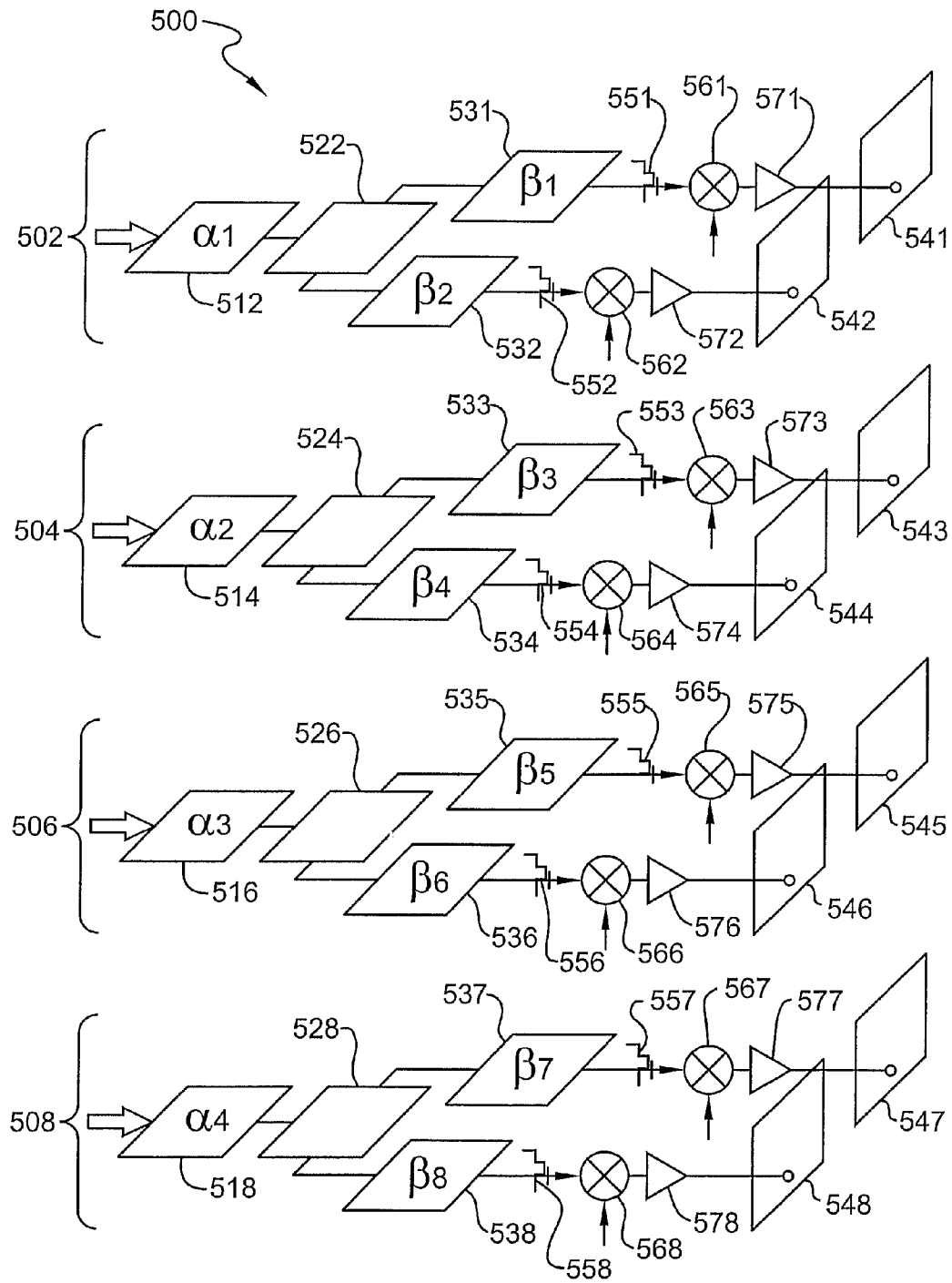
FIG. 9 illustrates a phased array antenna, able to steer the antenna beam in azimuth and elevation, in accordance with an exemplary embodiment of the invention.

FIG. 9 illustrates a PAA, able to steer the antenna beam in azimuth and elevation, in accordance with an exemplary embodiment of the invention. The exemplary PAA of FIG. 9 has four elementary blocks 502, 504, 506, 508. Persons skilled in art will readily appreciate that the construction of a PAA can be made of a plurality of distributed elementary blocks, and that the present example is shown for the convenience of providing a simple and clear explanation of the present invention. In FIG. 9 numerals 541, 542, 543, 544, 545, 546, 547, 548 refer to radiators, numerals 571, 572, 573, 574, 575, 576, 577, 578 refer to amplifiers, numerals 561, 562, 563, 564, 565, 566, 567, 568 refer to mixers, numerals 551, 552, 553, 554, 555, 556, 557, 558 refer to sampling couplers, numerals 512, 514, 516, 518 refer to PSIPPOs used to steer the antenna beam in the elevation direction, and numerals 531, 532, 533, 534, 535, 536, 537, 538 refer to PSIPPOs are used to steer the antenna beam in the azimuth direction. In an exemplary embodiment of the invention PSIPPOs 531, 533, 535, 537 are being phase shifted by angle $\beta1$, $\beta3$, $\beta5$, $\beta7$ respectively, PSIPPOs 532, 534, 536, 538 are being phase shifted by angle $\beta2$, $\beta4$, $\beta6$, $\beta8$ respectively, and PSIPPOs 512, 514, 516, 518, are being phased shifted by angle $\alpha1$, $\alpha2$, $\alpha3$, $\alpha4$ respectively. In a particular example angles $\beta1=\beta3=\beta5=\beta7=100$ degrees, angles $\beta2=\beta4=\beta6=\beta8=0$ degrees, and angle $\alpha4=-150$ degrees, angle $\alpha2=-50$ degrees, angle $\alpha3=+50$ degrees, angle $\alpha4=+150$ degrees. Other angles will be readily appreciated from the above example.

The system described in FIG. 9 is an example of simple PAA, able to steer the beam in elevation and azimuth. Taking as reference the block 502, the signal generated by the distributed network of PSIPPO has the purpose of providing the mixers 561, 562 with the proper RF pump, for up-converting the modulating signal. The modulating signal will enter the mixers as indicated by the arrows shown in the symbols of the mixers. The sampling capacitors 551, 552 have the purpose of providing the down converters of the receiver (not shown) with the proper pump for down-converting the received signal.

FIG. 5 also demonstrates a distributed PAA architecture, in the sense that a PSSIO, such as 512, 514, 516, 518 affects more than one radiator, while in a non-distributed architecture such as demonstrated by FIG. 1 a phase shifter in a T/R module, for instance 112, 114, 116 or 118, affects only one radiator.

Figure 10:
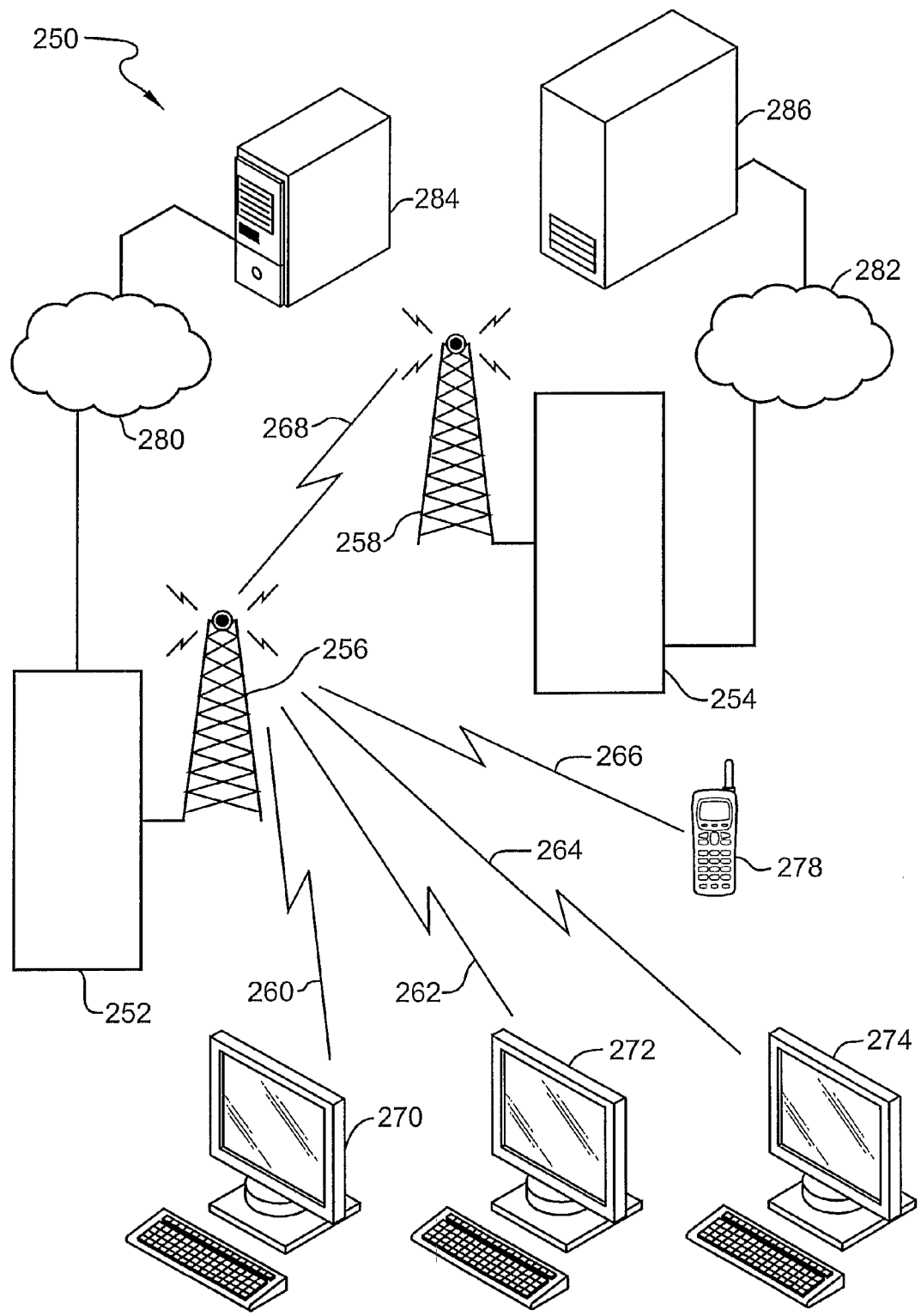
FIG. 10 illustrates a wireless network system, in accordance with exemplary embodiments of the invention.

FIG. 10 illustrates a wireless network system 250, in accordance with exemplary embodiments of the invention. In accordance with the system 250 an enhanced and improved wireless communication network is disclosed. System 250 comprises a plurality of wireless access point 252, 254 each using a PAAs 256, 258 that transmit and receive signals 260, 262, 264, 266, 268. A portion of the signals 260, 262, 264, 266 is used for communication between a plurality of wireless devices such as personal computers 270, 272, 274 and hand held device 278. The wireless devices can access a first network 280 through the use of access point 252 and can thus communicate with other remote computers 284 or other remote portable devices, which may include hand held devices and wireless telecommunication devices, including wireless and network phones. In the present exemplary figure the first network 280 and second network 282 are not connected via a hard line. Access points 252, 254 using the PAAs of 256, 258 of the present invention are in communication range and can therefore bridge between the first and the second networks 282. The use of wide band access points 256, 258 which may employ Wi-Fi or Wi-Max technology can assist in allowing communication between remote computers 284, 286. The use of the wireless access points 252, 254, having PAAs of the present invention will enable significantly more users to access and use each wireless access point as a result of the use of the new and improved PAAs shown in accordance with the present invention. The use of PAAs 252, 254 having a plurality PSIPPOs (not shown) would therefore allow the provision of service currently not available, such as network phone usage, video telephone calls, significant data download and upload capabilities and any other service which require additional bandwidth and the ability to handle many more users or subscribers with a lower amount of access points.

Figure 11:
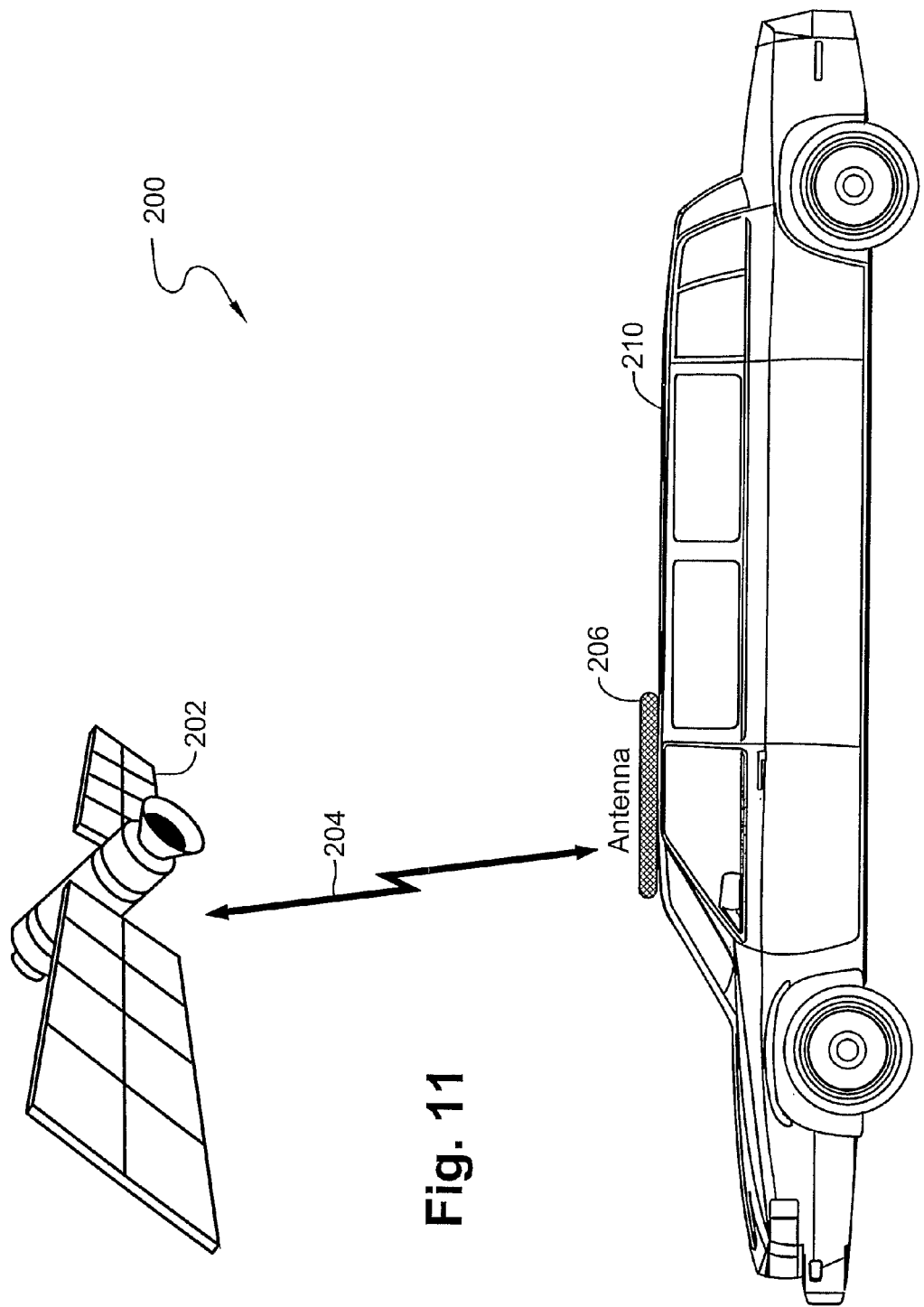
FIG. 11 illustrates a satellite mobile television system in accordance with exemplary embodiments of the invention.

FIG. 11 illustrates a satellite mobile television system 200 in accordance with exemplary embodiments of the invention. A satellite 202 transmits signals 204. A PAA 206, placed on a roof or other location visible to the sky of a vehicle 210, receives the signals and transmits corresponding signals to a television set (TV) placed inside the vehicle 210. Persons skilled in the art will appreciate that the above systems are exemplary and serve to explain some of the many available applications for the new and improved PAA of the present invention. In a PAA, according to exemplary embodiments of the invention, a plurality of PSIPPO are used and when the PSIPPO are organized in certain exemplary architectures of the invention, the resulting PAA is advantageous, such as lower cost or lower power consumption. It will be further appreciated that the PAA of the present invention can be used for any data receiving and transmitting device to include satellite antennas, antennas used by data exchange or switching devices and the like.

The present invention has been described using non-limiting detailed descriptions of embodiments thereof that are provided by way of example and are not intended to limit the scope of the invention. It should be understood that features or steps described with respect to one embodiment may be used with other embodiments and that not all embodiments of the invention have all of the features or steps shown in a particular figure or described with respect to one of the embodiments. It is noted that some of the above described embodiments may describe the best mode contemplated by the inventors and therefore include structure, acts or details of structures and acts that may not be essential to the invention and which are described as examples.

Structure and acts described herein are replaceable by equivalents, which perform the same function, even if the structure or acts are different, as known in the art. Therefore, only the elements and limitations as used in the claims limit the scope of the invention. Furthermore, the terms "comprise", "include", "have" and their conjugates mean, when used in the claims, "including but not limited to".

The invention claimed is:

1. An oscillator for shifting the phase of an input reference signal, comprising:
   (a) a reflection amplifier;
   (b) a band rejection filter comprising at least one variable capacitor and at least one resonator; wherein said band rejection filter is connected to the input of said reflection amplifier, and wherein the oscillator is used to shift the phase of the reference signal for processing a signal via a phased array antenna system by controlling said at least one variable capacitor.

2. An oscillator according to claim 1, wherein the band rejection filter is a two port band rejection filter.

3. An oscillator according to claim 1, wherein an input reference signal is injected into the oscillator.

4. An oscillator according to claim 1, wherein the output signal of the oscillator is locked.

5. An oscillator according to claim 1, wherein the oscillator is voltage controlled.

6. An oscillator for shifting the phase of an input reference signal, comprising:
   a power divider having a first output and a second output;
   a time delay unit having an input and an output, wherein its input is connected to said second output of said power driver;
   a band rejection filter having a first signal input, a second signal input a first output and a second output, wherein its first signal input is connected to said time delay unit and its second signal input is connected to said power divider first output;
   at least two reflection amplifiers, each having one input and one output, wherein one of said at least two reflection amplifiers input is connected to said first output of said band rejection filter and the other reflection amplifiers input is connected to said second output of said band rejection filter; and
   a power combiner having two inputs connected to said two reflection amplifiers outputs.

7. The oscillator according to claim 6, wherein the power combiner has an output which is used to provide a phase shifted signal to a phased array antenna system.

8. The oscillator of claim 6 wherein the band rejection filter comprises at least two variable capacitors and at least two inductors implementing a resonator.

9. The oscillator of claim 8 wherein the variable capacitors are voltage controlled by a signal generated by a DSP unit.

10. A phased shifted injection locked push-push oscillator comprising:
    (a) a power divider operative to divide a received reference signal into a first portion and into a second portion, the second portion is time delayed by a predetermined amount of delay time, relative to the first portion; and
    (b) a push-push oscillator receiving the first and second portions and generating an output signal; wherein the push-push oscillator comprises a band rejection filter adapted to selectively change the phase of said output signal resulting in an output signal having a controlled phase shifted relative to the phase of the reference signal.

11. The phased shifted injection locked push-push oscillator according to claim 10, wherein the output signal of the push-push oscillator serves to up or down convert a signal in a phased array antenna system.

12. A phased shifted injection locked push-push oscillator according to claim 10, wherein the power divider is a zero degree power divider.

13. A phased shifted injection locked push-push oscillator according to claim 12, wherein the power divider is a Wilkinson power divider.

14. A phased shifted injection locked push-push oscillator according to claim 10, wherein the generated output signal has stability characteristics about the same as the received reference signal.

15. A phased shifted injection locked push-push oscillator according to claim 12, wherein the generated output signal has noise characteristics about the same as the received reference signal.

16. A phased shifted injection locked push-push oscillator according to claim 10, wherein the predetermined amount of delay time is of about half of the period of the reference signal.

17. A phased shifted injection locked push-push oscillator according to claim 10, wherein the predetermined amount of delay time is an odd multiple of about half of the period of the reference signal.

18. A phased shifted injection locked push-push oscillator according to claim 10, wherein the generated output signal has the same frequency and about the same noise characteristics the received reference signal.

19. A phased shifted injection locked push-push oscillator according to claim 10, wherein the phase shift of the output signal relative to the received reference signal is in the range of about −100 to about +100 degrees.

20. A phased shifted injection locked push-push oscillator according to claim 10, wherein the band rejection filter comprises at least two variable capacitors.

21. A phased shifted injection locked push-push oscillator according to claim 10, wherein the variable capacitors are used for changing the resonant frequency of the band rejection filter.

22. A method for phase shifting an injection locked push-push oscillator, comprising:
   (a) dividing a received input reference signal into a first portion and into a second portion, the second portion is time delayed by a predetermined amount of delay time, relative to the first portion; and
   (b) receiving the first and second portions by a push-push oscillator; and
   (c) generating an output signal by the push-push oscillator; wherein the push-push oscillator is adapted to selectively change the phase of the first or second portions resulting in an output signal having a controlled phase shifted relative to the phase of said input reference signal.

23. The method according to claim 22, wherein the output signal generated by the push-push oscillator is used to provide a phase shifted signal for up or down conversion of a signal in a phased array antenna system.

24. A method according to claim 22, wherein the predetermined amount of delay time the second portion is delayed relative to the first portion is about half the period of the reference signal.

25. A method according to claim 22, wherein the predetermined amount of time delay the second portion is delayed relative to the first portion is an odd multiple of about half the period of the reference signal.

26. A phased array antenna transmitter/receiver module comprising:
   (a) at least one level of phased shifted injection locked push-push oscillator according to claim 1; and
   (b) a receiving functionality receiving a sampled portion of power subsequently handled by the at least one level of phased shifted injection locked push-push oscillators.

27. A method for phase shifting an injection locked push-push oscillator, comprising:
   receiving a first signal having a phase;
   dividing the first signal and injecting a first portion of the first signal into a band rejection filter and a second portion of the first signal into a time delay unit;
   selectively changing the resonant frequency of the first or second portion of the first signal;
   oscillating the first portion and the second portion of the first signal between the band rejection filter and at least two reflection amplifiers;
   combining the first and second portions of the first signal from the at least two reflection amplifiers; and
   outputting the combined signal.

28. The method according to claim 27, wherein the outputted combined signal is used for up or down conversion of a signal in a phased array antenna system.

29. The method of claim 27 wherein the first signal is a reference signal or signal from a previous phase shifting an injection locked push-push oscillator.

30. The method of claim 27 wherein the combined signal is outputted to another phase shifting an injection locked push-push oscillator or to a radiator.

31. The method of claim 27 wherein the combined signal has about twice the frequency and twice the phase shift of the first signal.

32. The method of claim 27 wherein the time delay unit creates a time delay of about half the period of the first signal.

33. A phased array antenna having a steer-able antenna beam in azimuth and elevation, the antenna comprising: a plurality of radiators, amplifiers, mixers, sampling couplers and phase shifter injection locked push-push oscillators, said phase shifter injection locked push-push oscillators are used for steering the antenna beam in the elevation and azimuth direction, wherein each of the phased shifted injection locked push-push oscillators comprise:
   (a) a power divider operative to divide a received reference signal into a first portion and into a second portion, the second portion is time delayed by a predetermined amount of delay time, relative to the first portion; and
   (b) a push-push oscillator receiving the first and second portions and generating an output signal; wherein the push-push oscillator comprises a band rejection filter adapted to selectively change the phase of the first or second portions resulting in an output signal having a phase shifted relative to the phase of the reference signal.

* * * * *